United States Patent [19]

Kawaguchi et al.

[11] Patent Number: 4,701,279

[45] Date of Patent: Oct. 20, 1987

[54] ANISOTROPICALLY ELECTROCONDUCTIVE ADHESIVES

[75] Inventors: Toshiyuki Kawaguchi; Hideki Suzuki; Tsuneo Usuda, all of Saitama, Japan

[73] Assignee: Shin-Etsu Polymer Co., Ltd., Tokyo, Japan

[21] Appl. No.: 897,369

[22] Filed: Aug. 15, 1986

[30] Foreign Application Priority Data

Aug. 16, 1985 [JP] Japan ................................ 60-180350

[51] Int. Cl.$^4$ .............................................. H01B 1/06
[52] U.S. Cl. ..................................... 252/511; 252/512; 252/514; 252/516; 252/518; 252/513; 524/401; 524/439; 524/440; 524/500
[58] Field of Search ............... 252/511, 512, 516, 518, 252/514, 513, 502; 524/439, 401, 440, 495, 442, 500, 502, 504, 515

[56] References Cited

U.S. PATENT DOCUMENTS

| | | | |
|---|---|---|---|
| 3,567,607 | 3/1971 | Saunders et al. | 252/511 |
| 3,806,558 | 4/1974 | Fischer | 252/511 |
| 3,862,056 | 1/1975 | Haitman | 252/511 |
| 4,042,534 | 8/1977 | Andrianov et al. | 252/511 |
| 4,568,592 | 2/1986 | Kanaguchi et al. | 252/512 |
| 4,592,861 | 6/1986 | Bepele et al. | 252/511 |
| 4,624,801 | 11/1986 | Kanaguchi et al. | 252/511 |

*Primary Examiner*—Josephine L. Barr
*Attorney, Agent, or Firm*—Jules E. Goldberg

[57] ABSTRACT

An anisotropically electroconductive adhesive which is solid at room temperature, preferably, in the form of a film is prepared by dispersing conductive particles such as metal particles and the like in a thermoplastic insulating adhesive composition comprising an unvulcanized thermoplastic elastomer such as a styrene-based elastomer and a crosslinked synthetic rubber and/or thermoplastic elastomer as a vulcanizate derived from an unvulcanized synthetic rubber or thermoplastic elastomer using a vulcanizing agent such as organic peroxides. The conductive adhesive is useful in adhesively bonding, for example, two electronic circuit boards without disadvantages of instability of the electric resistance, inconvenience in the application and so on.

6 Claims, No Drawings

ANISOTROPICALLY ELECTROCONDUCTIVE ADHESIVES

BACKGROUND OF THE INVENTION

The present invention relates to an anisotropically electroconductive adhesive composition or, more particularly, to an anisotropically electroconductive adhesive composition capable of adhesively bonding two circuit boards between the terminals thereof by a procedure in which a bit of the adhesive is placed between the terminals followed by hot-pressing to produce electric connection between the terminals simultaneously with adhesive bonding.

A diversity of adhesives are known in the prior art for adhesively bonding two electric or electronic circuit boards and establishing electric connection between the terminals thereof at the same time as bonding including those prepared by compounding an electrically conductive particulate material with a thermoplastic polymer such as polyurethanes, polyesters, synthetic rubbers and the like or a heat-curable resin such as epoxy resins, silicone resins and the like.

These conventional conductive adhesives, however, have various disadvantages and are not quite satisfactory. For example, the above named adhesives based on a thermoplastic resin as the matrix may be subject to eventual decrease in the holding power of the base resin or the conductive particles under a high temperature or high humidity condition to cause weakened contact between the terminal and the conductive particles and the electric resistance therebetween is sometimes unstable under such an adverse condition due to microscopic migration of the conductive particles accompanying the flow of the matrix resin to come off the condition of point-contact along with the disadvantages of decrease in the adhesive bonding strength and increase in the electric resistance between the terminals bonded with the adhesive. The adhesives based on the above named heat-curable resins, on the other hand, also have several defects and problems in different respects such as the troublesome procedure of weighing and compounding the component ingredients directly before use for the bonding work since such heat-curable adhesives are mostly supplied in two separate packages each containing the ingredient or ingredients differing from thoss contained in the other package in order to avoid premature setting or curing of the adhesive. The ready-mixed heat-curable adhesive is unavoidably accompanied by a disadvantage of limited length of workable time due to their relatively short pot life. This disadvantage in respect of the limited pot life is also involved even in so-called one package-type adhesives supplied in one package containing all of the necessary ingredients ready-mixed together. Such a ready-mixed adhesive composition is subject to increase, though gradual, of the viscosity or consistency in the lapse of time during storage so that difficulties are encountered in the setting of the working conditions therewith in addition to the problems of decrease in the adhesive bonding strength and increase in the electric resistance between the bonded terminals as well as the poor mass-productivity.

SUMMARY OF THE INVENTION

The present invention accordingly provides an anisotropically electroconductive adhesive which comprises:

(a) an electrically insulating homogeneous polymeric adhesive composition as the matrix which is a mixture composed of
  (a-1) an uncrosslinked thermoplastic elastomer, and
  (a-2) a crosslinked thermoplastic elastomer or a crosslinked synthetic rubber in an amount of, preferably, at least 25% by weight of the component (a-1); and (b) electroconductive particles uniformly dispersed in the electrically insulating polymeric adhesive composition as the component (a).

DETAILED DESCRIPTION OF THE PREFERRED EMBODIMENTS

The inventors have conducted extensive investigations with an object to obtain an anisotropically electroconductive adhesive without the above-described disadvantages and problems in the prior art adhesives of similar types and, as a result, arrived at a discovery that an adhesive composition prepared according to the above described formulation is advantageous in respect of the absence of the undesirable phenomena of increase in the electric resistance and decrease in the creeping characteristics even under a high-temperature or high-humidity condition in addition to little changes in the properties in the lapse of time during storage basically as an inherent nature of the thermoplastic resins leading to the completion of the present invention after detailed studies on various parameters.

The anisotropically electroconductive adhesive of the invention is prepared by dispersing conductive particles in an above-described thermoplastic insulating adhesive as the matrix. The thermoplastic insulating adhesive as the component (a) is a composition or mixture comprising (a-1) an uncrosslinked or unvulcanized thermoplastic elastomer and (a-2) a crosslinked or vulcanized synthetic rubber or thermoplastic elastomer.

The thermoplastic elastomer here implied is exemplified by block copolymers of styrene and butadiene or isoprene and hydrogenated products thereof, referred to as "a styrene-based elastomer" hereinbelow, products of polyaddition reaction between a diol compound such as polyethers, polyesters and the like and an aromatic diisocyanate, block-wise copolymers of polyesters or polyethers, butyl-grafted polyethylenes, mixtures or reaction products of an EPDM and polypropylene, copolymers of a dimethylpolysiloxane and styrene and the like.

The synthetic rubber as the component (a-2) used in the crosslinked or vulcanized form is exemplified by butadiene rubbers, isoprene rubbers, chloroprene rubbers, silicone rubbers, EPDM rubbers and the like, and they are used after vulcanizaiton with sulfur or, preferably, with an organic peroxide in view of their non-contaminous nature of organic peroxides. These crosslinking or vulcanizing agents can be used also for the thermoplastic elastomer when it is used as the component (a-2) after crosslinking or vulcanization.

The thermoplastic insulating adhesive as the component (a) is a mixture of the above-described uncrosslinked thermoplastic elastomer as the part component (a-1) and a vulcanized or crosslinked synthetic rubber or thermoplastic elastomer as the part component (a-2). These components should preferably be compatible with each other as highly as possible because the adhesive as the matrix should be homogeneous. In this regard, it is preferable that the vulcanized or crosslinked thermoplastic elastomer or synthetic rubber should have a solubility parameter or so-called SP value in the proximity to that of the block-wise copolymeric moiety in the unvulcanized thermoplastic elastomers contributing to the rubbery elasticity. Thus, for example, styrene-butadiene based synthetic rubbers or butadiene-based synthetic rubbers are preferred when the thermoplastic elastomer is a styrene-based elastomer and butadiene-based rubbers are preferred when the thermoplastic elastomer is a butyl-grafted polyethylene. Further, EPDM rubbers are preferred when the thermoplastic elastomer is a reaction product of EPDM and polypropylene. When, in particular, the thermoplastic elastomer is a styrene-based rubber which is a mixture of a styrene-butadiene-styrene block copolymer, referred to as an S-B-S copolymer hereinbelow, having unsaturation in the butadiene blocks, a styrene-isoprene-styrene block copolymer, referred to as an S-I-S copolymer hereinbelow, having unsaturation in the isoprene blocks and a hydrogenated product thereof to saturate the unsaturated linkages into the form of a styrene-ethylbutadiene-styrene block copolymer, referred to as an S-EB-S copolymer hereinbelow, the unsaturated linkages therein may be selectively crosslinked by use of an organic peroxide.

In connection with the compounding ratio of the unvulcanized thermoplastic elastomer as the part component (a-1) and the vulcanized or crosslinked synthetic rubber or thermoplastic elastomer as the part component (a-2), it is preferable that the amount of the latter should be at least 25 parts by weight per 100 parts by weight of the former. More preferably, the weight ratio of the uncrosslinked thermoplastic elastomer to the crosslinked thermoplastic elastomer or synthetic rubber should be in the range from 3:1 to 1:4. An excessively large amount of the crosslinked polymer relative to the uncrosslinked polymer leads to a loss of the thermoplasticity of the adhesive composition so that the bonding works with the adhesive must be performed under severer conditions in respect of the temperature and pressure which may cause thermal and mechanical damages to the circuit boards as the objective bodies of adhesive bonding. When the amount of the vulcanized or crosslinked polymer is too small, on the other hand, the stability of the electric resistance may be decreased in a high temperature or high-humidity condition.

The blending work of the uncrosslinked thermoplastic elastomer and the vulcanized synthetic rubber and/or thermoplastic elastomer can be carried out by merely mixing two solutions uniformly each containing a desired amount of the uncrosslinked or crosslinked polymer separately prepared by dissolving the respective polymer in a solvent using a suitable mixing machine. Alternatively, a suitable amount of a vulcanizing agent such as sulfur or an organic peroxide is admixed with, for example, an uncrosslinked thermoplastic elastomer and an uncrosslinked synthetic rubber in an organic solvent or by dry-kneading of them on a hot roller mill and then the solution is cast or the kneaded mixture is used for topping on to a carrier film for film formation. The elastomer film supported on the carrier film is, after removal of the solvent when used, then subjected to a heat treatment in an oven to effect vulcanization of the synthetic rubber or partial vulcanization of the thermoplastic elastomer. When the amount of the vulcanizing agent is adequately controlled, in this case, the resultant polymeric mixture is a blend of an uncrosslinked thermoplastic elastomer and a crosslinked synthetic rubber and/or thermoplastic elastomer in the above specified compounding ratio without the troublesome separate preparation of the crosslinked polymer in advance. Furthermore, the compounding ratio of the uncrosslinked and crosslinked polymers as desired can be easily obtained with reproducibility by mixing an uncrosslinkable thermoplastic elastomer and a crosslinkable synthetic rubber and/or thermoplastic elestomer in an appropriate weight proportion followed by selective vulcanization or crosslink formation of the latter polymer or polymers only.

The electroconductive particles as the component (b) added to and dispersed as a dispersant in the above-described thermoplastic insulating adhesive as the matrix may be selected from conventional ones as exemplified by particles of a metal such as gold, silver, palladium, nickel, tin, tungsten, solder alloys and the like, particles of a ceramic such as molybdenum disilicide $MoSi_2$, tungsten carbide WC, titanium carbide TiC and the like and carbon. The conductive dispersant as the component (b) is not particularly limited to those of a particulate form but can be of a fibrous form. For example, chopped carbon fibers and whiskers of metals and ceramics can be used quite satisfactorily though with a limitation in the aspect ratio. Among the above named conductive particles, ceramic particles may exhibit a characteristic advantage of self-cleaning by breaking through the contaminant layer on the electrode or terminal of the circuit board to thrust into the metal-made body thereof when pressed down since the ceramics generally have a higher hardness than metals to increase the contacting area between the conductive particles and the metal-made electrode or terminal. The particles to be added should preferably have a sphericity as good as possible. The particle size or diameter of the conductive particles should usually be so small as not to exceed about one third of the pitch at which the terminals as the object of connection are arranged on the circuit board. The amount of the conductive particles should be in the range from 5 to 30 parts by volume to 100 parts by volume of the thermoplastic insulating adhesive as the matrix or the component (a).

The anisotropically conductive adhesive of the invention can be obtained by uniformly mixing predetermined amounts of the above-described thermoplastic insulating adhesive and the conductive particles with optional addition of various kinds of additives according to need including, for example, tackifying resins such as coumarone-indene resins, methylindene resins, modified wood rosins, terpene resins, alkylphenol resins and the like, aging retarders such as the amine-based, hydroquinone-based, quinoline-based and phenol-based ones and vulcanizing accelerators such as metal oxides, metal carbonates, amines and the like. It is important, however, to pay attention to the compatibility of the tackifying agent with the thermoplastic insulating adhesive and to select a tackifying agent which would not cause phase separation during storage, especially, when a considerably large amount of the tackifying agent is compounded. It is preferred to choose a tackifying agent which is fully compatible at least with the butadiene blocks of the molecules of the styrene-based elastomer used as the thermoplastic elastomer.

The anisotropic conductive adhesive according to the present invention is solid at room temperature. Two electronic circuit boards are adhesively bonded using the same with simultaneous establishment of electric connection between the opposite terminals when a bit of the inventive adhesive is placed between the terminals and the circuit boards are pressed together under a pressure of 5 to 40 kg/cm$^2$ at a temperature of 130° to 170° C. so that the conductive particles contained in the molten adhesive exclude the adhesive out of the place. The means of placing the inventive adhesive between the terminals of the circuit boards is not particularly limitative. For example, one or both of the circuit boards to be bonded may be coated with the adhesive by a known method such as thick-film printing and the like. A recommendable way from the standpoint of convenience in the applicaiton is the use of a piece of an appropriate size obtained by cutting a film-formed adhesive prepared by shaping using an extruder or a coater. The thickness of the film-formed adhesive should preferably be in the range from about 0.5 times to 1.5 times of the average diameter of the conductive particles or, more preferably, should be smaller than the average particle diameter thereof since, when the thickness of the film-formed adhesive is too large, the electric resistance between the terminals by the contact of the conductive particles thereto may be increased because of the increase in the amount of the insulating adhesive remaining unexcluded as a result of increase in the volume of the adhesive to be excluded by pressing the circuit boards for electric connection. It would be difficult to obtain a sufficiently high adhesive bonding strength, on the other hand, when the thickness of the film-formed adhesive is too small. When the film-formed adhesive contains an excessively large amount of the vulcanized synthetic rubber or thermoplastic elastomer as compared to the amount of the unvulcanized thermoplastic elestomer, in particular, it is advantageous that the thickness of the film-formed adhesive is relatively small in order to decrease the volume of the adhesive to be excluded in consideration of the low flowability of the vulcanized components.

In the following, the anisotropically electroconductive adhesive of the invention is described in more detail by way of an example and comparative example, in which the expression of "parts" always refers to "parts by weight".

EXAMPLE

A solution was prepared by dissolving and dispersing 30 parts of a linear-chain elastomer of the S-EB-S type copolymer (Kraton G1657, a product by Shell Chemical Co.), 70 parts of a linear-chain elastomer of the S-I-S type copolymer (Cariflex TR-1117, a product by Shell Chemical Co.), 40 parts of a polyterpene resin (Wingtack 95, a product by Goodyear Tire & Rubber Co.), 30 parts of a coumarone-indene resin (V-120, a product by Nittetsu Chemical Co.), 2.1 parts of dicumyl peroxide (Di-cup 40C, a product by Hercules, Inc.), 1 part of a phenolic aging retarder (Irganox 565, a product by Ciba-Geigy Co.) and 169 parts of a powder of electroconductive tungsten carbide (SL #350, a product by Fukuda Kinzoku Hakufun Co.) in 200 parts of xylene. A Teflon sheet having a thickness of 0.050 mm was coated therewith to form a coating layer having a thickness of 0.03 mm using a knife-roll followed by heating at 100° C. for 20 minutes to evaporate the solvent and then at 170° C. for 3 minutes to vulcanize the S-I-S type elastomer.

Subsequently, the film of the adhesive thus formed on the Teflon sheet was peeled off from the Teflon sheet and placed between a flexible substrate for circuit board having terminals at a pitch of 0.2 mm and a glass substrate plate coated with a vapor-deposited surface film of indium oxide and having terminals at a pitch of 0.2 mm followed by pressing on the flexible board with heating at 150° C. under a pressure of 30 kg/cm$^2$ to adhesively bond the flexible board and the glass plate. The electric resistance between the opposite terminals was measured over a period up to 1000 hours at 85° C. and the change thereof in the lapse of time was recorded to give the results shown in Table 1 below.

For comparison, the same experiment as above was carried out excepting the omission of dicumyl peroxide as the vulcanizing agent. Measurement was made of the change of the electric resistance between the opposite terminals in the lapse of time in a similar manner to above to give the results also shown in Table 1.

TABLE 1

| | | As pre-pared | After 240 hours | After 500 hours | After 1000 hours |
|---|---|---|---|---|---|
| Inventive Example | Average, ohms | 50.6 | 80.1 | 82.3 | 93.2 |
| | Minimum, ohms | 45.3 | 48.3 | 47.2 | 50.9 |
| | Maximum, ohms | 72.8 | 99.4 | 138.2 | 153.1 |
| Comparative Example | Average, ohms | 51.3 | 173.6 | 212.4 | 336.8 |
| | Minimum, ohms | 44.1 | 48.2 | 49.9 | 72.8 |
| | Maximum, ohms | 63.9 | 420.8 | 740.3 | 739.9 |

What is claimed is:

1. An anisotropically electroconductive composition which comprises:
   (a) an electrically insulating homogeneous polymeric adhesive composition as the matrix which is a mixture comprising
      (a-1) an uncrosslinked thermoplastic elastomer, and
      (a-2) a crosslinked thermoplastic elastomer or a crosslinked synthetic rubber selected from the group consisting of butadiene rubbers, isoprene rubbers, chloroprene rubbers, silicone rubbers, and EPDM rubbers, in an amount of at least 25% by weight based on the amount of component (a-1), said thermoplastic elastomer being selected from the group consisting of styrene based elastomer products of the polyaddition reaction between a diol and an aromatic diisocyanate, block-wise copolymers of polyesters, block-wise copolymers of polyethers, butyl-grafter polyethylenes, mixtures or reaction products of an EPDM and polypropylene, and copolymers of dimethylpolysiloxane and styrene; and
   (b) electroconductive particles in an electroconductive effective amount uniformly dispersed in the electrically insulating polymeric adhesive composition as the component (a).

2. The anisotropically electroconductive adhesive composition as claimed in claim 1 in which the crosslinks in the synthetic rubber or thermoplastic elastomer is formed in the presence of an organic peroxide.

3. The anisotropically electroconductive adhesive composition as claimed in claim 1 in which the thermoplastic elastomer is a styrene-based elastomer.

4. The anisotropically electroconductive adhesive composition as claimed in claim 1 in which the synthetic rubber is a synthetic rubber of styrene-butadiene type or a synthetic rubber of styrene-isoprene type.

5. The anisotropically electroconductive adhesive composition as claimed in claim 1 in which the electrically insulating homogeneous polymeric adhesive composition as the component (a) comprises the uncrosslinked thermoplastic elastomer and the crosslinked thermoplastic elastomer or synthetic rubber in a weight ratio in the range from 3:1 to 1:4.

6. The composition of claim 1 wherein the amount of component (b) is 5 to 30 parts by volume to 100 parts of the total of components (a-1) and (a-2).

* * * * *